(12) United States Patent
Nagaura et al.

(10) Patent No.: US 8,980,414 B2
(45) Date of Patent: Mar. 17, 2015

(54) CARRIER-ATTACHED COPPER FOIL

(75) Inventors: Tomota Nagaura, Hitachi (JP); Kazuhiko Sakaguchi, Hitachi (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/823,349

(22) PCT Filed: Aug. 30, 2012

(86) PCT No.: PCT/JP2012/072052
§ 371 (c)(1), (2), (4) Date: Apr. 18, 2013

(87) PCT Pub. No.: WO2013/031913
PCT Pub. Date: Mar. 7, 2013

(65) Prior Publication Data
US 2013/0216855 A1    Aug. 22, 2013

(30) Foreign Application Priority Data
Aug. 31, 2011    (JP) .................................. 2011-189183

(51) Int. Cl.
| | | |
|---|---|---|
| B32B 15/00 | (2006.01) | |
| B32B 15/20 | (2006.01) | |
| H05K 1/09 | (2006.01) | |
| B32B 15/01 | (2006.01) | |
| C25D 1/04 | (2006.01) | |
| C25D 3/04 | (2006.01) | |
| C25D 3/12 | (2006.01) | |
| C25D 3/38 | (2006.01) | |
| C25D 3/58 | (2006.01) | |
| C25D 5/14 | (2006.01) | |
| C25D 7/06 | (2006.01) | |
| C25D 9/08 | (2006.01) | |
| C23C 28/02 | (2006.01) | |

(52) U.S. Cl.
CPC *H05K 1/09* (2013.01); *B32B 15/01* (2013.01); *C25D 1/04* (2013.01); *C25D 3/04* (2013.01); *C25D 3/12* (2013.01); *C25D 3/38* (2013.01); *C25D 3/58* (2013.01); *C25D 5/14* (2013.01); *C25D 7/0614* (2013.01); *C25D 9/08* (2013.01); *C23C 28/023* (2013.01)

USPC ........... 428/209; 428/615; 428/618; 428/632; 428/640; 428/668; 428/671; 428/675; 428/678; 428/680; 428/682; 428/701

(58) Field of Classification Search
USPC ......... 428/209, 615, 618, 632, 640, 668, 671, 428/675, 678, 680, 682, 701
See application file for complete search history.

(56) References Cited

U.S. PATENT DOCUMENTS

| | | | | |
|---|---|---|---|---|
| 4,503,112 A | * | 3/1985 | Konicek ......................... | 428/216 |
| 5,114,543 A | * | 5/1992 | Kajiwara et al. ............... | 205/152 |
| 6,346,335 B1 | * | 2/2002 | Chen et al. ..................... | 428/629 |
| 6,660,406 B2 | * | 12/2003 | Yamamoto et al. ........... | 428/615 |
| 6,924,043 B2 | * | 8/2005 | Suzuki et al. .................. | 428/615 |
| 7,175,920 B2 | * | 2/2007 | Suzuki et al. .................. | 428/615 |
| 7,223,481 B2 | * | 5/2007 | Suzuki et al. .................. | 428/612 |
| 2004/0038049 A1 | | 2/2004 | Suzuki et al. | |

FOREIGN PATENT DOCUMENTS

| | | |
|---|---|---|
| CN | 1984526 A | 6/2007 |
| JP | 2002292788 A | 10/2002 |
| JP | 2007007937 A | 1/2007 |
| JP | 2010006071 A | 1/2010 |
| WO | 0224444 A1 | 3/2002 |

OTHER PUBLICATIONS

Translation of International Preliminary Report on Patentability, mailed Mar. 13, 2014, in PCT/JP2012/072052.

* cited by examiner

*Primary Examiner* — Cathy Lam
(74) *Attorney, Agent, or Firm* — Drinker Biddle & Reath LLP

(57) ABSTRACT

The present invention provides a carrier-attached copper foil, wherein an ultrathin copper foil is not peeled from the carrier prior to the lamination to an insulating substrate, but can be peeled from the carrier after the lamination to the insulating substrate. A carrier-attached copper foil comprising a copper foil carrier, an intermediate layer laminated on the copper foil carrier, and an ultrathin copper layer laminated on the intermediate layer, wherein the intermediate foil is configured with a Ni layer in contact with an interface of the copper foil carrier and a Cr layer in contact with an interface of the ultrathin copper layer, said Ni layer containing 1,000-40,000 µg/dm² of Ni and said Cr layer containing 10-100 µg/dm² of Cr is provided.

23 Claims, No Drawings

CARRIER-ATTACHED COPPER FOIL

FIELD OF THE INVENTION

The present invention relates to a carrier-attached copper foil. More particularly, the present invention relates to a carrier-attached copper foil for use as a material for printed wiring board.

BACKGROUND OF THE INVENTION

In general, a printed wiring board is produced by the steps of bonding an insulating substrate to a copper foil to form a copper clad laminate and forming a conductive pattern on the copper foil surface by etching. With increase in the recent needs for miniaturization and higher performance of electronic devices, high density mounting of components and high frequency of signal have progressed and therefore it is demanded that the printed wiring boards meet the requirements of refinement (fine pitching) of the conductive pattern and of adapting to high frequencies.

Corresponding to the fine pitching, a copper foil having a thickness of 9 μm or less, furthermore preferably 5 μm or less, is recently demanded. However, such an ultrathin copper foil has a low mechanical strength and accordingly there are such problems as breakage and generation of creases during the production of the printed wiring board. Accordingly, a carrier-attached copper foil, wherein a thick metal foil is adopted as the carrier and an ultrathin copper layer is electrodeposited on the carrier via a peeling layer between them, has been proposed. A generally adopted manner of use of the carrier-attached copper foil is such that the surface of the ultrathin copper layer is laminated and hot-pressed to an insulating substrate and then the carrier is peeled via the peeling layer.

Heretofore, it is publicly known that the peeling layer is formed with Cr, Ni, Co, Fe, Mo, Ti, W, P, or their alloys or hydrates. In addition, patent documents disclose that Ni, Fe or their alloy layer is effective as an underlying layer for the peeling layer in order to stabilize the peeling property in a high temperature atmosphere such as hot pressing. (Japanese Patent Application Public Disclosure No. 2010-006071, and Japanese Patent Application Public Disclosure No. 2007-007937).

These publications disclose that uniform plating on the peeling layer is very difficult due to the inherent peeling property of the peeling layer and accordingly there are cases where a great number of pinholes are formed in the ultrathin copper foil depending on the plating conditions. To cope with this problem, the publications disclose that a strike copper layer is first plated on the peeling layer and then copper is plated on the strike copper layer, whereby uniform plating is formed and the number of pin holes in the ultrathin copper foil can be remarkably reduced.

PRIOR ART REFERENCES

Patent document 1: Japanese Patent Application Public Disclosure No. 2010-006071
Patent document 2: Japanese Patent Application Public Disclosure No. 2007-007937

SUMMARY OF THE INVENTION

Problem to be Solved by the Present Invention

In the carrier-attached copper foil, it is required that, prior to the lamination to the insulating substrate, the ultrathin copper layer must be prevented from peeling from the carrier, while, after the lamination to the insulating substrate, the ultrathin copper layer should be able to be peeled from the carrier. Further, in the carrier-attached copper foil, pin holes in the surface of the ultrathin copper layer are not preferable because these lead to poor performance of the printed wiring board.

On these points, the prior art has not yet sufficiently studied and there is still room for improvement.

Accordingly, an object of the present invention is to provide a carrier-attached copper foil, wherein, prior to the lamination to the insulating substrate, the ultrathin copper layer is prevented from peeling from the carrier, while, after the lamination to the insulating substrate, the ultrathin copper foil layer is peelable.

Another object of the present invention is to provide a carrier-attached copper foil, wherein generation of pin holes on the surface of the ultrathin copper layer is suppressed.

Means for Solving the Problem

To achieve the above-mentioned objects, the inventors have conducted extensive studies and discovered that it is very effective when a copper foil is used as the carrier and an intermediate layer configured with two layers, namely a Ni-layer and an ultrathin Cr-layer, is formed between the ultrathin copper layer and the carrier.

The present invention has been completed based on the above-mentioned discovery. In one aspect, the present invention provides a carrier-attached copper foil comprising a copper foil carrier, an intermediate layer laminated on the copper foil carrier, and an ultrathin copper layer laminated on the intermediate layer, wherein the intermediate foil is configured with a Ni layer in contact with an interface of the copper foil carrier and a Cr layer in contact with an interface of the ultrathin copper layer, said Ni layer containing 1,000-40,000 μg/dm$^2$ of Ni and said Cr layer containing 10-100 μg/dm$^2$ of Cr.

In one embodiment of the present invention, the deposition amount of Ni is 1,000-10,000 μg/dm$^2$ and the deposition amount of Cr is 10-50 μg/dm$^2$.

In another embodiment of the present invention, the value of 1,000 times the mass ratio of Cr to Ni is within the range of 0.5-10.

In a further embodiment of the present invention, the Cr has been deposited by electrolytic chromating.

Effect of the Invention

The carrier-attached copper foil according to the present invention provides a necessary adhesion between the carrier and the ultrathin copper layer prior to the lamination to the insulating substrate on one hand, while the ultrathin copper layer can be easily peeled after the lamination on the other hand.

Also, the copper foil having a carrier according to the present invention is prevented from generation of pinholes and hence stable supply of the high quality ultrathin copper layer is made possible.

EMBODIMENTS OF THE INVENTION

1. Carrier

Copper foil may be used as a carrier in the present invention. The carrier is typically supplied in the form of a rolled copper foil or electrolytic copper foil. In general, the electrolytic copper foil is manufactured by electrodeposition of copper on a drum made of titanium or stainless steel from a plating bath containing copper sulfate, while the rolled copper foil is manufactured by repetition of plastic working with use of mill rolls and heat treatment. As the material for copper foil, tough pitch copper, oxygen-free copper or other high purity copper, as well as copper alloy containing Sn, Ag, Cr, Zr or Mg, copper alloy such as Corson copper alloy containing Ni and Si, etc. may be used. It should be noted that the term "copper foil", when used alone, includes copper alloy foil, too.

Although there is no particular restriction to the thickness of the carrier usable in the present invention, it may be adjusted to a thickness appropriate for achieving the role as the carrier, and at least 12 μm may be adopted, for instance. However, excessively thick carrier is not preferable from the aspect of the production cost and hence 70 μm or less is preferred. Accordingly, the thickness of the carrier is typically 12-70 μm, and more typically 18-35 μm.

2. Intermediate Layer

On either surface or both surfaces of the copper foil carrier, an intermediate layer configured with two layers of Ni and Cr is provided. The Ni layer is laminated on the interface with the copper foil carrier and the Cr layer is laminated on the interface with the ultrathin copper layer, respectively. As will be described later, since the adhesive strength between Ni and Cu is higher than the adhesive strength between Cr and Cu, the peeling occurs at the interface between the ultrathin copper layer and the Cr layer when the ultrathin copper layer is peeled. The Ni layer of the intermediate layer is expected to have a barrier effect of preventing copper from diffusing into the ultrathin copper layer. If the intermediate layer is provided only on one surface, it is preferred to form an anti-corrosion layer such as a plated Ni layer on the opposite surface of the copper foil carrier. Also, when an electrolytic copper foil is used as the carrier, the intermediate layer is preferably provided on the shiny surface in order to decrease pinholes.

The Ni layer constituting the intermediate layer may be formed by wet plating method such as electroplating, electroless plating and immersion plating, or dry plating method such as sputtering, CVD or PDV. The electroplating is preferred from the aspect of the cost.

Among the intermediate layer, the presence of the thin Cr layer at the interface with the ultrathin copper layer is very important for obtaining the properties that, prior to the lamination to an insulating substrate, the ultrathin copper layer is not peeled from the carrier on one hand, while, after the lamination to the insulating substrate, the ultrathin copper layer can be peeled from the carrier on the other hand. If the Cr layer is present in the interface between the carrier and the ultrathin copper layer and the Ni layer is not provided, the peeling property will be little enhanced. On the other hand, if the Ni layer is directly laminated with the ultrathin copper layer without the Cr layer, an appropriate peeling strength cannot be obtained for the reason that the peeling strength is too strong or too weak depending on the Ni content in the Ni layer. Incidentally, it is possible to mix Zn in the Cr layer.

Also, if the Cr layer is present at the boundary between the carrier and the Ni layer, the intermediate layer is peeled off together when the ultrathin copper layer is peeled. That is, there occurs peeling between the carrier and the intermediate layer. Such a situation can occur not only in the case where the Cr layer is provided at the interface with the carrier, but also in the case where the Cr layer is provided at the interface with the ultrathin copper layer and the Cr quantity is excessive. This is due to the fact that Cu and Ni easily form a solid solution and thus if they are kept in contact with each other, mutual diffusion increases the adhesion, making the peeling difficult, while Cr and Cu are difficult to generate a solid solution and mutual diffusion, whereby the adhesion is weak at their interface, making the peeling easy. Also, if the Ni content in the intermediate layer is insufficient, the carrier and the ultrathin copper layer are closely adhered and difficult to peel apart from each other because there is only a slight Cr between the carrier and the ultrathin copper layer.

The Cr layer can be formed at the interface with the ultrathin copper layer by first forming a Ni layer, thereafter depositing a minute amount of Cr by, for example, wet plating such as electrolytic chromating, electroplating, electroless plating and immersion plating, or dry plating such as sputtering, CVD and PVD, and then forming an ultrathin copper layer thereon. The electrolytic chromating is preferred from the standpoint of depositing Cr at a low cost.

In the present invention, the amount of Ni is measured by ICP emission spectrometry after dissolving a specimen with a nitric acid solution having a concentration of 20 mass %, while the amount of Cr is determined by quantitative analysis using atomic absorption spectrometry after dissolving a specimen with a hydrochloric acid having a concentration of 7 mass %. If a surface treatment such as plating containing Ni or Cr is performed on the surface of the ultrathin copper layer, the ultrathin copper layer may be peeled from the carrier-attached copper foil and then measurement for the amounts of Ni and Cr may be made with respect to the residual carrier.

From the above-mentioned aspects, it has been determined that the deposition amount of Cr in the intermediate layer is 10-100 μg/dm$^2$ and the deposition amount of Ni in the intermediate layer is 1,000-40,000 μg/dm$^2$. Although there is a tendency that the higher the Ni amount the more is the number of pinholes, the number can be suppressed when the deposition amount is within this range. From the aspects of uniformly and evenly peeling the ultrathin copper layer and of suppressing the pinholes, the deposition amount of Cr is preferably 10-50 μg/dm$^2$ and more preferably 10-40 μg/dm$^2$, while the deposition amount of Ni is preferably 1,000-10,000 μg/dm$^2$ and more preferably 1,500-9,000 μg/dm$^2$.

Further, it is preferred that the value of 1,000 times the mass ratio of Cr to Ni, namely, 1,000*(deposition amount of Cr (μg/dm$^2$))/(deposition amount of Ni (μg/dm$^2$)), is in the range of 0.5-10, and more preferably 1-9. This is because the generation of pinholes is suppressed and the peeling property of the ultrathin copper foil is improved by adjustment of the ratio of Ni to Cr to this range.

3. Ultrathin Copper Layer

An ultrathin copper layer is provided on the intermediate layer. The ultrathin copper layer can be formed by electroplating which utilizes an electrolysis bath of copper sulfate, copper pyrophosphate, copper sulfamate, copper cyanide or the like. Among them, the copper sulfate bath is preferred because this bath is generally used for producing electrolytic copper foils and formation of copper foil is possible at a high current density. There is no particular restriction to the thickness of the ultrathin copper layer but the thickness is generally thinner than the carrier and is 12 μm or less for instance. It is typically 0.5-12 μm and more typically 2-5 μm.

4. Roughening Treatment

A roughening treatment may be carried out on the surface of the ultrathin copper layer to provide a roughened layer for better adhesion to the insulating substrate, etc. The roughening treatment may be carried out by forming roughening particles of copper or copper alloy, for example. The roughening treatment may be fine roughening. The roughened layer may be a layer of a single metal or an alloy containing one or more selected from the group consisting of copper, nickel, phosphorus, tungsten, arsenic, molybdenum, chromium, cobalt and zinc. Also, after or without roughening treatment, secondary or tertiary particles and/or an anti-corrosion layer of a single metal or an alloy selected from nickel, cobalt, copper and zinc may be formed and thereafter treatments such as a chromate treatment and silane coupling treatment may be carried out. More particularly, at least one layer selected from an anticorrosion layer, a chromate treatment layer and a silane coupling treatment layer may be formed on the surface of the roughened layer, or at least one layer selected from an anticorrosion layer, a chromate treatment layer and a silane coupling treatment layer may be formed on the ultrathin copper layer.

5. Carrier-Attached Copper Foil

In this way, a carrier-attached copper foil is manufactured, which comprises a copper foil carrier, an intermediate layer comprising a Ni layer and a Cr layer laminated in this order on the copper foil carrier, and an ultrathin copper layer laminated on the intermediate layer.

The manner of use of the carrier-attached copper foil is well known to those skilled in the art. For example, the surface of the ultrathin copper foil is laminated and hot-pressed to an insulating substrate such as paper-based phenol resin, paper-based epoxy resin, synthetic fiber cloth-based epoxy resin, composite glass cloth/paper-based epoxy resin, composite glass cloth/glass nonwoven cloth-based epoxy resin, glass cloth-based epoxy resin, polyester film and polyimide film. Then, after peeling off the carrier, the ultrathin copper layer bonded to the insulating substrate is subject to etching in an aimed conductive pattern and finally a printed wiring board cab be manufactured. With the carrier-attached copper foil according to the present invention, the location of peeling is mainly at the interface between the Cr layer and the ultrathin copper layer.

EXAMPLES

In the following, the present invention will be explained in details by examples, but it should be understood that the present invention is not restricted to these examples.

1. Production of a Carrier-Attached Copper Foil

No. 1

As a copper foil carrier, a long length of an electrolytic copper foil having a thickness of 35 μm (JTC manufactured by JX Nippon Mining & Metals Corporation) was prepared. On the shiny side of this copper foil carrier, an electroplating of Ni layer was performed under the following conditions, using a roll-to-roll continuous plating line, and thus a Ni layer having a deposition amount of 4,000 μg/dm$^2$ was formed.

Ni Layer:
Nickel sulfate: 250-300 g/L
Nickel chloride: 35-45 g/L
Nickel acetate: 10-20 g/L
Trisodium citrate: 15-30 g/L
Brightener: Saccharine, butynediol or others
Dodecyl sodium sulfate: 30-100 ppm
pH: 4-6
Bath temperature: 50-70° C.
Current density: 3-15 A/dm$^2$ After rinsing with water and pickling, a Cr layer was subsequently deposited by electrolytic chromating on the Ni layer in a deposition amount of 11 μg/dm$^2$ using a roll-to-roll continuous plating line under the following conditions.

Electrolytic Chromating Treatment
Composition of solution: potassium dichromate: 1-10 g/L and Zinc 0-5 g/L
pH: 3-4
Solution temperature: 50-60° C.
Current density: 0.1-2.6 A/dm$^2$
Quantity of coulomb: 0.5-30 As/dm$^2$ Subsequently, an ultrathin copper layer having a thickness of 5-10 μm was formed by electroplating on the Cr layer using the continuous roll-to-roll plating line under the following conditions.

Ultrathin Copper Layer
Copper concentration: 30-120 g/L
H$_2$SO concentration: 20-120 g/L
Temperature of electrolytic solution: 20-80° C.
Current density: 10-100 A/dm$^2$ Nos. 2-23

The test No. 1 was modified by adjusting the line speed to vary Ni and Cr deposition amount as shown in Table 1 to produce the various carrier-attached copper foils of Nos. 2-23. The examples of the zero deposition of Ni or Cr are the cases where Ni plating or electrolytic chromating was not performed.

Also, with respect to the examples of Nos. 1, 7, 14 and 18, the surface of the ultrathin copper layer was subjected to roughening treatment, anti-corrosion treatment, chromating treatment and silane coupling treatment in this sequence.

Roughening Treatment
Cu: 10-20 g/L
Co: 1-10 g/L
Ni: 1-10 g/L
pH: 1-4
Solution temperature: 40-50° C.
Current density Dk: 20-30 A/dm$^2$
Time: 1-5 seconds
Cu deposition: 15-40 mg/cm$^2$
Co deposition: 100-3,000 μg/dm$^2$
Ni deposition: 100-1,000 μg/dm$^2$ Anti-Corrosion Treatment
Zn: more than 0 up to 20 g/L
Ni: more than 0 up to 5 g/L
pH: 2.5-4.5
Solution temperature: 30-50° C.
Current density Dk: more than 0 up to 1.7 A/dm$^2$
Time: 1 sec.
Zn deposition: 5-250 μg/dm$^2$
Ni deposition: 5-300 μg/dm$^2$ Chromating Treatment
K$_2$Cr$_2$O$_7$ (Na$_2$Cr$_2$O$_7$ or CrO$_3$): 2-10 g/L
NaOH or KOH: 10-50 g/L
ZnO or ZnSO$_4$.7H$_2$O: 0.05-10 g/L
pH: 7-13
Bath temperature: 20-80° C.
Current density: 0.05-5 A/dm$^2$
Time: 5-30 seconds.
Cr deposition: 10-150 μg/dm$^2$ Silane Coupling Treatment
Aqueous solution of vinyl triethoxysilane
(Concentration of vinyl triethoxysilane: 0.1-1.4 wt %)
pH: 4-5
Bath temperature: 25-60° C.
Immersion time: 5-30 seconds.

Also, with respect to the examples of Nos. 4, 5, 19, 20 and 21, the following roughening treatments 1 and 2, anticorrosion treatment, chromating treatment, and silane coupling treatment were carried out in this order on the surface of the ultrathin copper foil.

Roughening Treatment 1
(Composition of Solution 1)
Cu: 10-30 g/L
H$_2$SO$_4$: 10-150 g/L
W: 0-50 mg/L Dodecyl sodium sulfate: 0-50 mg/L
As: 0-200 mg/L
(Electroplating condition 1)
Temperature: 30-70° C.
Current density: 25-110 A/dm$^2$
Roughening coulomb: 50-500 As/dm$^2$
Plating time: 0.5-20 seconds
Roughening Treatment 2
(Composition of Solution 2)
Cu: 20-80 g/L
H$_2$SO$_4$: 50-200 g/L
(Electroplating condition 2)
Temperature: 30-70° C.
Current density: 5-50 A/dm$^2$
Roughening coulomb: 50-300 As/dm$^2$
Plating time: 1-60 seconds
Anticorrosion Treatment
(Composition of Solution)
NaOH: 40-200 g/L
NaCN: 70-250 g/L
CuCN: 50-200 g/L
Zn(CN)$_2$: 2-100 g/L
As$_2$O$_3$: 0.01-1 g/L
(Solution temperature)
40-90° C.
(Current conditions)
Current density: 1-50 A/dm$^2$
Plating time: 1-20 seconds
Chromating Treatment:
K$_2$Cr$_2$O$_7$ (Na$_2$Cr$_2$O$_7$ or CrO$_3$): 2-10 g/L
NaOH or KOH: 10-50 g/L
ZnOH or ZnSO$_4$.7H$_2$O: 0.05-10 g/L
pH: 7-13
Bath temperature: 20-80° C.
Current density: 0.05-5 A/dm$^2$
Time: 5-30 seconds.
Silane Coupling Treatment
Aqueous solution of 0.1 vol %-0.3 vol % of 3-glycidoxypropyltrimethoxysilane was spray-coated and then dried and heated at 100-200° C. for 0.1-10 seconds in the air.

Also, with respect to Nos. 2, 6, 8, 22 and 23, the following roughening treatments 1 and 2, anticorrosion treatment, chromating treatment, and silane coupling treatment were carried out in this sequence.
Roughening Treatment 1
Composition of Solution: Cu: 10-20 g/L, sulfuric acid: 50-100 g/L
Solution temperature: 25-50° C.
Current density: 1-58 A/dm$^2$
Coulomb quantity: 4-81 As/dm$^2$
Roughening Treatment 2
Composition of Solution: Cu: 10-20 g/L, Ni: 5-15 g/L, Co: 5-15 g/L
pH: 2-3
Solution temperature: 30-50° C.
Current density: 24-50 A/dm$^2$
Coulomb quantity: 34-48 As/dm$^2$
Anti-Corrosion Treatment
Composition of Solution: Ni 5-20 g/L, Co: 1-8 g/L
pH: 2-3
Solution temperature: 40-60° C.
Current density: 5-20 A/dm$^2$
Coulomb quantity: 10-20 As/dm$^2$
Chromating Treatment
Composition of Solution: potassium dichromate 1-10 g/L, zinc 0-5 g/L
pH: 3-4
Bath temperature: 50-60° C.
Current density: 0-2 A/dm$^2$ (electroless chromating was applicable due to immersion chromating)
Coulomb quantity: 0-2 As/dm$^2$ (electroless chromating was applicable due to immersion chromating)
Silane coupling treatment
Coating with aqueous solution of diaminosilane (concentration of diaminosilane: 0.1-0.5 wt %)

2. Property Evaluation of the Carrier-attached Copper Foil

With respect to the carrier-attached copper foil produced according to the above conditions, property evaluation was performed in the following manners. The results are shown in Table 1. Incidentally, with respect to Nos. 1-8, 14 and 18-23, property evaluation was performed for both cases where the surface treatment was not carried out on the surface of the ultrathin copper layer and where the surface treatment was carried out. Table 1 shows the results of the case where the surface treatment was not carried out on the surface of the ultrathin copper layer. The results of property evaluation where the surface treatment was carried out on the surface of the ultrathin copper layer were similar to those where the surface treatment was not carried out on the surface of the ultrathin copper layer.

Pinholes

The number of the pinholes was visually counted using as a light source a backlight for photography of consumer use. The evaluation was based on the following criteria.

x: Number of pinholes exceeds 10,000/dm$^2$
Δ: There are some locations where the number of pinholes exceeds 10,000/dm$^2$
○: Number of pinholes is 100-10,000/dm$^2$
⊚: Number of pinholes is less than 100/dm$^2$ Peel Strength (After BT Press)

The ultrathin copper layer side of the carrier-attached copper foil was laminated to a BT substrate and pressed at 195° C. for 2 hours and the carrier foil was peeled off to measure the peel strength.

TABLE 1

| No. | Category | Ni deposition (μg/dm2) | Cr deposition (μg/dm2) | Cr/Ni *1000 | Pinholes | Peel strength (after BT press) |
|---|---|---|---|---|---|---|
| 1 | Inventive Example | 4,000 | 11 | 2.75 | ○ | Non-unifrom peeling (partial adhesion) |
| 2 | Inventive Example | 9,000 | 11 | 1.22 | ○ | Non-unifrom peeling (partial adhesion) |
| 3 | Inventive Example | 4,000 | 25 | 6.25 | ⊚ | ○ (peelable) |
| 4 | Inventive Example | 9,000 | 25 | 2.78 | ⊚ | ○ |

TABLE 1-continued

| No. | Category | Ni deposition (µg/dm2) | Cr deposition (µg/dm2) | Cr/Ni *1000 | Pinholes | Peel strength (after BT press) |
|---|---|---|---|---|---|---|
| 5 | Inventive Example | 4,000 | 35 | 8.75 | ◎ | ○ |
| 6 | Inventive Example | 9,000 | 35 | 3.89 | ◎ | ○ |
| 7 | Inventive Example | 40,000 | 25 | 0.63 | Δ | ○ |
| 8 | Inventive Example | 40,000 | 35 | 0.88 | Δ | ○ |
| 9 | Comparative Example | 0 | 25 | — | — | Not peelable (close adhesion) |
| 10 | Comparative Example | 4,000 | 0 | 0.00 | ◎ | Not peelable (close adhesion) |
| 11 | Comparative Example | 9,000 | 0 | 0.00 | ◎ | Not peelable (close adhesion) |
| 12 | Comparative Example | 40,000 | 0 | 0.00 | X | Peeled during in plating line due to insufficient adhesion |
| 13 | Comparative Example | 90,000 | 0 | 0.00 | See through (many PH) | Peeled during in plating line due to insufficient adhesion |
| 14 | Inventive Example | 40,000 | 11 | 0.28 | Δ | Non-unifrom peeling (partial adhesion) |
| 15 | Comparative Example | 90,000 | 11 | 0.12 | X | Peeled during in plating line due to insufficient adhesion |
| 16 | Comparative Example | 90,000 | 25 | 0.28 | X | Peeled during in plating line due to insufficient adhesion |
| 17 | Comparative Example | 90,000 | 35 | 0.39 | X | Peeled during in plating line due to insufficient adhesion |
| 18 | Inventive Example | 1,000 | 11 | 11.00 | ○ | Non-unifrom peeling (partial adhesion) |
| 19 | Inventive Example | 2,000 | 12 | 6.00 | ◎ | ○ (peelable) |
| 20 | Inventive Example | 1,500 | 10 | 6.67 | ◎ | ○ (peelable) |
| 21 | Inventive Example | 35,000 | 90 | 2.57 | Δ | ○ (peelable) |
| 22 | Inventive Example | 9,000 | 60 | 6.67 | Δ | ○ (peelable) |
| 23 | Inventive Example | 15,000 | 50 | 3.33 | ○ | ○ (peelable) |

What is claimed is:

1. A carrier-attached copper foil comprising a copper foil carrier, an intermediate layer laminated on the copper foil carrier, and an ultrathin copper layer laminated on the intermediate layer, wherein the intermediate layer is configured with a Ni layer in contact with an interface of the copper foil carrier and a Cr-containing layer in contact with an interface of the ultrathin copper layer, said Ni layer containing 1,000-40,000 µg/dm² of Ni and said Cr-containing layer containing 10-100 µg/dm² of Cr, wherein said Cr-containing layer further contains Zn.

2. The carrier-attached copper foil according to claim 1, wherein the deposition amount of Ni is 1,000-10,000 µg/dm² and the deposition amount of Cr is 10-50 µg/dm².

3. The carrier-attached copper foil according to claim 1, wherein the mass ratio of Cr to Ni is within the range 0.0005:1 to 0.0101:1.

4. The carrier-attached copper foil according to claim 1, wherein the Cr of the Cr-containing layer has been deposited by electrolytic chromating.

5. The carrier-attached copper foil according to claim 1, wherein said Cr-containing layer is formed by electrolytic chromating, wet plating or dry plating.

6. The carrier-attached copper foil according to claim 1, wherein a roughened layer is formed on a surface of the ultrathin copper layer, wherein the surface is opposite to the surface which contacts the Cr-containing layer.

7. The carrier-attached copper foil according to claim 6, wherein said roughened layer is a layer of a single metal or an alloy containing one or more selected from the group consisting of copper, nickel, phosphorus, tungsten, arsenic, molybdenum, chromium, cobalt and zinc.

8. The carrier-attached copper foil according to claim 6, wherein at least one layer selected from an anticorrosion layer, a chromate treatment layer and a silane coupling treatment layer is formed on a surface of the roughened layer.

9. The carrier-attached copper foil according to claim 1, wherein at least one layer selected from an anticorrosion layer, a chromate treatment layer and a silane coupling treatment layer is formed on a surface of the ultrathin copper layer.

10. A printed wiring board manufactured from the carrier-attached copper foil according to claim 1.

11. A copper clad laminate manufactured from the carrier-attached copper foil according to claim 1.

12. An electronic device manufactured from the carrier-attached copper foil according to claim 1.

13. A carrier-attached copper foil comprising a copper foil carrier, an intermediate layer laminated on the copper foil carrier, and an ultrathin copper layer laminated on the intermediate layer, wherein the intermediate layer is configured with a Ni layer in contact with an interface of the copper foil carrier and a chromate or Cr-plated layer in contact with an interface of the ultrathin copper layer, said Ni layer containing 1,000-40,000 µg/dm² of Ni and said chromate or Cr-plated layer containing 10-100 µg/dm² of Cr, wherein said chromate or Cr-plated layer further contains Zn.

14. The carrier-attached copper foil according to claim 13, wherein the deposition amount of Ni is 1,000-10,000 µg/dm² and the deposition amount of Cr is 10-50 µg/dm².

15. The carrier-attached copper foil according to claim 13, wherein the mass ratio of Cr to Ni is within the range 0.0005:1 to 0.010:1.

16. The carrier-attached copper foil according to claim 13, wherein the Cr has been deposited by electrolytic chromating.

17. The carrier-attached copper foil according to claim 13, wherein a roughened layer is formed on a surface of the ultrathin copper layer, wherein the surface is opposite to the surface which contacts the chromate or Cr-plated layer.

18. The carrier-attached copper foil according to claim 17, wherein said roughened layer is a layer of a single metal or an alloy containing one or more selected from the group consisting of copper, nickel, phosphorus, tungsten, arsenic, molybdenum, chromium, cobalt and zinc.

19. The carrier-attached copper foil according to claim 17, wherein at least one layer selected from an anticorrosion layer, a chromate treatment layer and a silane coupling treatment layer is formed on a surface of the roughened layer.

20. The carrier-attached copper foil according to 13, wherein at least one layer selected from an anticorrosion layer, a chromate treatment layer and a silane coupling treatment layer is formed on a surface of the ultrathin copper layer.

21. A printed wiring board manufactured from the carrier-attached copper foil according to claim 13.

22. A copper clad laminate manufactured from the carrier-attached copper foil according to claim 13.

23. An electronic device manufactured from the carrier-attached copper foil according to claim 13.

\* \* \* \* \*